United States Patent [19]
Ema

[11] Patent Number: 5,012,443
[45] Date of Patent: Apr. 30, 1991

[54] SEMICONDUCTOR STATIC RAM INCLUDING LOAD RESISTORS FORMED ON DIFFERENT LAYERS

[75] Inventor: Taiji Ema, Kawasaki, Japan

[73] Assignee: Fujitsu Limited, Kanagawa, Japan

[21] Appl. No.: 280,473

[22] Filed: Dec. 6, 1988

[30] Foreign Application Priority Data

Dec. 9, 1987 [JP] Japan .................................. 62-311578

[51] Int. Cl.⁵ .......................... G11C 5/02; G11C 5/06
[52] U.S. Cl. ........................................ 365/51; 365/63;
365/154; 357/51; 357/71
[58] Field of Search ................... 365/154, 51, 174, 63,
365/72; 357/45, 51, 71

[56] References Cited

U.S. PATENT DOCUMENTS

4,322,824  3/1982  Allan .................................. 357/59 F
4,326,213  4/1982  Shirai et al. ........................ 357/59 F
4,481,524  11/1984 Tsujide .............................. 357/59 J
4,774,203  9/1988  Ikeda et al. ........................ 357/59 F
4,853,894  8/1989  Yamanaka et al. ................. 365/154

Primary Examiner—Glenn Gossage
Attorney, Agent, or Firm—Armstrong, Nikaido, Marmelstein, Kubovcik & Murray

[57] ABSTRACT

A static random access memory device including resistance loaded flip-flop circuits has adjacent memory cells arranged to form memory cell pairs. Each memory cell pair has a first unit cell and a second unit cell. Load resistors for the first unit cells and load resistors for the second unit cells are formed on different insulation layers and are stacked on each other on the substrate. A structural pattern of the load resistors is extended over adjacent memory cells in order for the length and resistance of the resistors to be increased. The length of the load resistors can be cut down for compensating for the increase in the resistance enabling the reduction in size of other devices, and enabling the packing density of the device to be increased.

11 Claims, 5 Drawing Sheets

SEMICONDUCTOR STATIC RAM INCLUDING LOAD RESISTORS FORMED ON DIFFERENT LAYERS

BACKGROUND OF THE INVENTION

1. Field of the Invention

The present invention relates to a semiconductor random access memory device. More particularly, this invention relates to a structure forming load resistances which are used in a memory cell.

A static random access memory (hereinafter, "SRAM") device comprises a plurality of memory cells. Each cell comprises a pair of inverters which include a field effect transistor (hereinafter, "FET") and its load. Generally, FETs or resistors are used for the load of the inverter. However, in recent high packing density memory device technology, resistors are becoming the main current for the load of the inverter since they can be formed over the FET which uses them as the load. Accordingly, decreasing the area of the unit cell and increasing the packing density of the memory cells in the device can be achieved.

2. Description of the Relevant Art

Figure 1A:
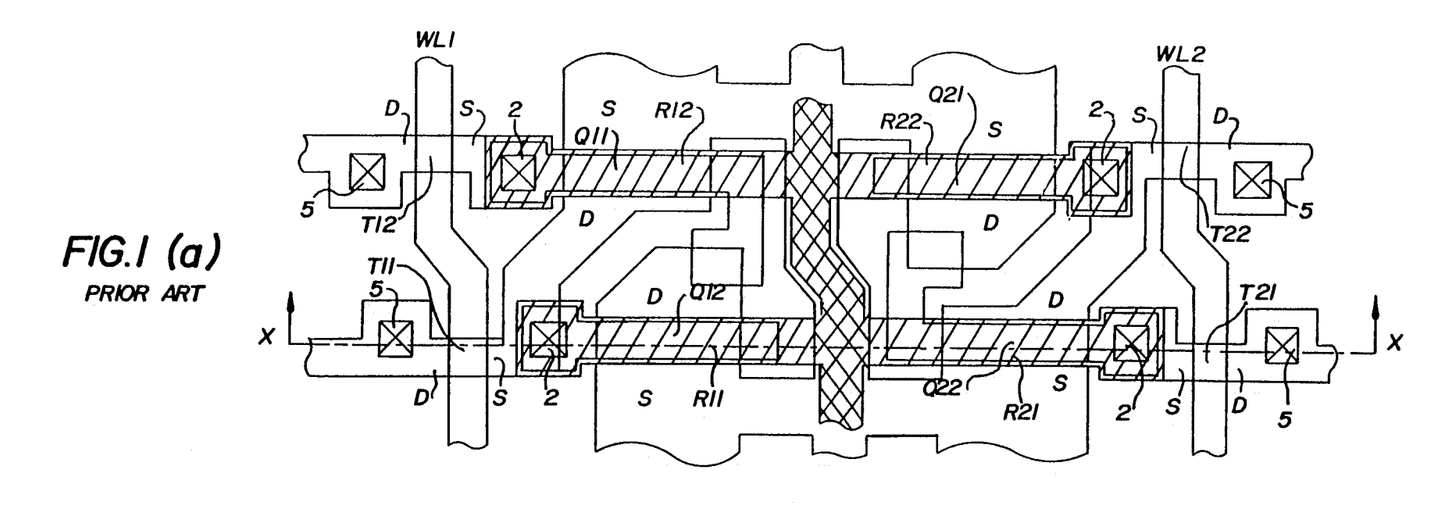
FIG. 1(a) is a schematic plan view illustrating arrangement of electrodes and wirings of a memory cell pair.
Figure 1B:
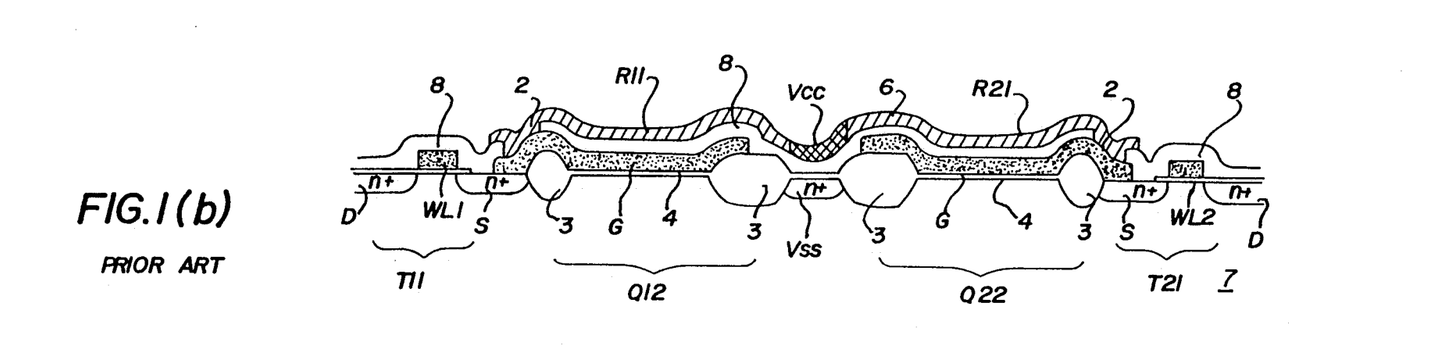
FIG. 1(b) is a schematic cross-sectional view of the device taken in the direction of arrows X—X shown in FIG. 1.

An exemplary configuration of a resistance loaded memory cell is shown in FIGS. 1(a) and (b). FIG. 1(a) is a schematic plan view illustrating an arrangement of electrodes and wirings of a memory cell pair. The left and right halves of FIG. 1(a) show a standard memory cell. FIG. 1(b) is a schematic cross-sectional view of the device taken in the direction of arrow X—X shown in FIG. 1(a). In FIG. 1(a), reference characters S and D designate source and drain regions of the FETs, respectively. Gate electrodes G of inverter FETs Q11, Q12, Q21, Q22 run in a horizontal direction between the source region S and drain region D in FIG. 1(a). Although gate electrodes G cannot be seen in FIG. 1(a), they can be seen in FIG. 1(b). Over the gate electrodes G, load resistors R11, R12, R21 and R22 are formed and separated from the gate electrodes G by an insulation layer 8. One end of each load resistance is connected to a respective gate electrode G through a respective gate contact hole 2. Field oxide layers 3 separate the devices from each other. The gate electrodes G are formed over respective gate oxide layers 4.

In FIG. 1(b), the source and drain regions of the FETs Q12 and Q22 cannot be seen since the cross-section is taken at a plane cutting the device just along the gate G. However, a typical cross-section of the FET can be seen at transfer transistors T11 and T21 which are located on both sides. The gates of these transfer transistors are respectively coupled to word lines WL1 and WL2, and their drains D are connected to bit lines (not shown) through drain contact holes 5 to convey the memory stored in the cell to an outer circuit. Respective portions of the word lines WL1 and WL2 crossing the transfer transistors T11, T12, T21 and T22 become their respective gate electrodes, as shown in the FIGS. 1(a) and (b). A voltage source line Vss is formed in the substrate 7 by diffusion and is buried between the field oxide layers 3. Another source line Vcc, as well as resistors, are formed over the surface of the insulation layer 8. The resistors R and Vcc lines shown in FIG. 1(a) are formed and patterned at the same time in similar fabrication steps.

Figure 2:
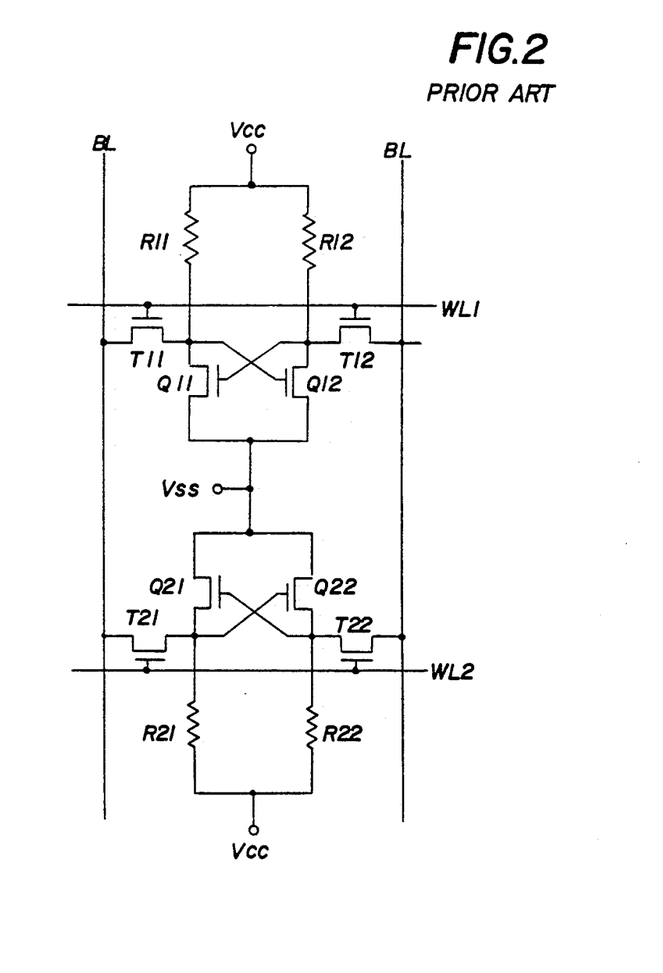
FIG. 2 is an equivalent circuit diagram of the memory cells of FIG. 1.

An equivalent circuit diagram of the device of FIGS. 1(a) and (b) is shown in FIG. 2. The upper and lower halves of the circuit represent a unit memory cell corresponding to the left and right halves of FIG. 1(a), respectively. Each unit cell is composed of a pair of inverters forming a flip-flop circuit. For example, each memory cell includes four FETs Q11, Q12, T11 and T12, and two load resistors R11, R12. When a word line WL1 is selected, for example, the transfer transistor T11 or T12 conveys the state information that Q11 or Q12 high level to a sense amplifier (not shown) via the bit lines BL or $\overline{BL}$ in order to have the memory read out.

As can be seen in FIGS. 1(a) and 1(b), the load resistors (R11, etc.) of the memory cell can be fabricated over the inverter FETs (Q11, Q12, etc.). Thus, the area of the unit cell can be made smaller when compared to a circuit which uses FETs as the load of the inverters. This is the main reason that recent SRAM technology uses a resistance load for the flip-flop circuits. However, as the packing density increases, the problems hereinafter described become apparent.

In order to make the packing density as high as possible, the size of the unit cell is desirably made to be as small as possible, while simultaneously making the value of the resistance of the load resistor as high as possible since high resistance reduces power consumption. However, the size of the memory cells having a structure like FIG. 1 is practically limited by the fabrication technique of the load resistance, but the size of the transistors still have room for reduction.

As an example, the resistance of the load resistors is required to be about $10^{12}$ Ohms, and the current running through the resistance at 5 volts is approximately a few pico amperes. A material actually used for fabricating such a high resistance for a semiconductor device is polysilicon (polycrystalline silicon). The size of the load resistor used for a 1M bit SRAM, for example, becomes about 1 $\mu$m wide, 3 $\mu$m long and 2,000 Å thick. From this size, the area occupied by the FET can be further reduced by photolithography, but the length of the load resistor cannot be reduced for reasons hereinafter described.

Generally, if resistance per unit length of the load resistors is increased, the size of the resistor can be decreased. In order to increase the resistance, however, the resistivity of the polysilicon must be increased, the thickness and the width of the resistor must be decreased, or the length of the resistor must be increased. However, there is a limit as to how much the resistivity of the polysilicon can be increased because there is a limitation as to how much the impurity concentration in the polysilicon can be reduced due to purity limitations of the material.

The thickness of the resistor also cannot be reduced very much due to the design of the device. As can be seen in FIGS. 1(a) and (b), the polysilicon layer 6 is used for load resistors R11, etc. Similarly, the same polysilicon layer 6 is used for fabricating the Vcc line of which the desired resistance is to be as low as possible. In order to decrease the resistance of the Vcc line, the portion of the Vcc line of the polysilicon layer 6 is ion-implanted in order to increase the conductivity. However, the conductivity of a thin polysilicon layer cannot be sufficiently increased because too much high doping of ion implantation causes a migration or diffusion of impurities in the lateral direction from the Vcc line. This causes a decrease in the resistance of the load resistor which is connected to the Vcc line. Therefore, a length of 3 $\mu$m, for example, for the load resistor is necessary.

Further, though it is not shown in the figures, some other portion of the polysilicon layer 6 is patterned in various ways and utilized for fabricating some other parts of the device, such as, a fuse element which is inevitable for such a high density memory device for increasing the yield of the production. A protection circuit for protecting the device from unexpected high voltage surge is also fabricated using the same polysilicon layer 6. These devices all require high conductivity for the polysilicon layer 6. Thus, a thicker polysilicon layer is desirable for these parts.

The width of the resistor, as well as the size of other elemental devices, may be decreased by photolithography in order for the length of the load resistor to be decreased. However, there is another difficulty which arises; namely, a resistor having a very high resistance value requiring increased length. As previously discussed, the values of the resistance of the load resistor is $10^{12}$ Ohms with a 3 $\mu$m length. However, having too short a length with high resistance causes instability due to surface instability and impurity diffusion. In the case of the resistance loaded cell shown in FIGS. 1(a) and (b), both sides of the load resistor contact high impurity regions, the Vcc line and the gate electrode. The impurities, especially those which are doped in the Vcc line, cause diffusion into the load resistor and decrease the effective length of the resistor.

It will be understood from FIG. 1(a) that the length of the resistor is already designed to the maximum length allowable in a unit cell. The resistors are extended over their full lengths between the Vcc line and the gate contact holes 2 which are located at another end of the inverter transistor Q. A further increase in the length causes an unnecessary elongation of the transistor Q; thereby, decreasing the packing density. Therefore, in order to fabricate a memory device having a further increased memory size, an increase in the size of the memory device is indispensable.

Efforts to increase the packing density in large scale integrated circuit (hereinafter, "LSI") are continuing in every field of semiconductor technology, especially in photolithographic technology. Even though photolithography is improved and the patterns of elemental devices are made smaller, the size of the SRAM is limited by the length of the load resistors for the reasons set forth above.

If the length of the load resistor from the drain of the inverter FET to the VCC line, hence the resistance of the load resistor, can be increased by extending it over the adjacent unit cell, a higher packing density can be achieved, because there is still sufficient room in the size of the inverter FET's to be reduced in size.

SUMMARY OF THE INVENTION

It is an object of the present invention to provide a SRAM with a memory cell structure which enables an increase in the length and resistance of load resistors which are formed over the unit cells.

It is another object of the present invention to cut down the size of unit cells, and to increase the packing density of the SRAM device.

It is a further object of the present invention to provide a SRAM device having an increased memory capacity.

In accordance with one embodiment of the present invention, the load resistors of each memory cell are formed on two layers separated from each other. All the memory cells are paired with respective adjoining memory cells. The load resistors for the first cells of the paired memory cells are formed on a first layer, while the load resistors for the second cells are formed on a second layer. Thus, each of the resistors can be extended over the adjoining unit cell for utilizing a full length for the neighboring unit cell. Therefore, the resistance of each of the resistors can be easily increased more than twice that of the prior art resistors previously discussed.

In view of the above structural arrangement for the instant invention, the process steps for fabricating the device are increased to some extent, but the advantages obtained by such a structure are clearly significant. For instance, if the same resistance value is used, the length of the load resistor can be decreased to about ½ of the length of the prior art resistor. This means that the limit of the size reduction imposed on the SRAM device caused by the length of the load resistor, as previously discussed, has been removed. So long as the sizes of the elemental devices can be reduced, the packing density of the SRAM can be increased by about four times. Similarly, a device having a memory capacity of about four times as large can be achieved without increasing the size.

With the above structural arrangement for this invention, further improvements are realized. For example, if polysilicon layers are added to separate the Vcc line from the layers of load resistors, thicker Vcc lines can be manufactured, and the load resistors can be made thinner as compared to the previously-discussed prior art devices. Other parts of the device, such as fuse and protection circuits, can be fabricated with the thicker layer. Therefore, the problems previously described can be overcome with the instant invention.

The foregoing and other objects, features and advantages of this invention will be apparent from the following, more particular, description of the preferred embodiments of this invention, as illustrated in the accompanying drawings.

BRIEF DESCRIPTION OF THE DRAWINGS

FIGS. 1(a) and (b) show a structure of memory cells of an exemplary resistance loaded SRAM, whereby

FIGS. 3(a) and (b) show a pair of memory cells of a SRAM illustrating a first embodiment of the present invention, wherein

FIGS. 5(a) and (b) illustrate a second embodiment of the present invention having the Vcc lines separated from the resistance layers, wherein

Throughout the drawings, similar or like reference characters designate the same parts or corresponding parts.

DESCRIPTION OF PREFERRED EMBODIMENTS

Figure 3A:
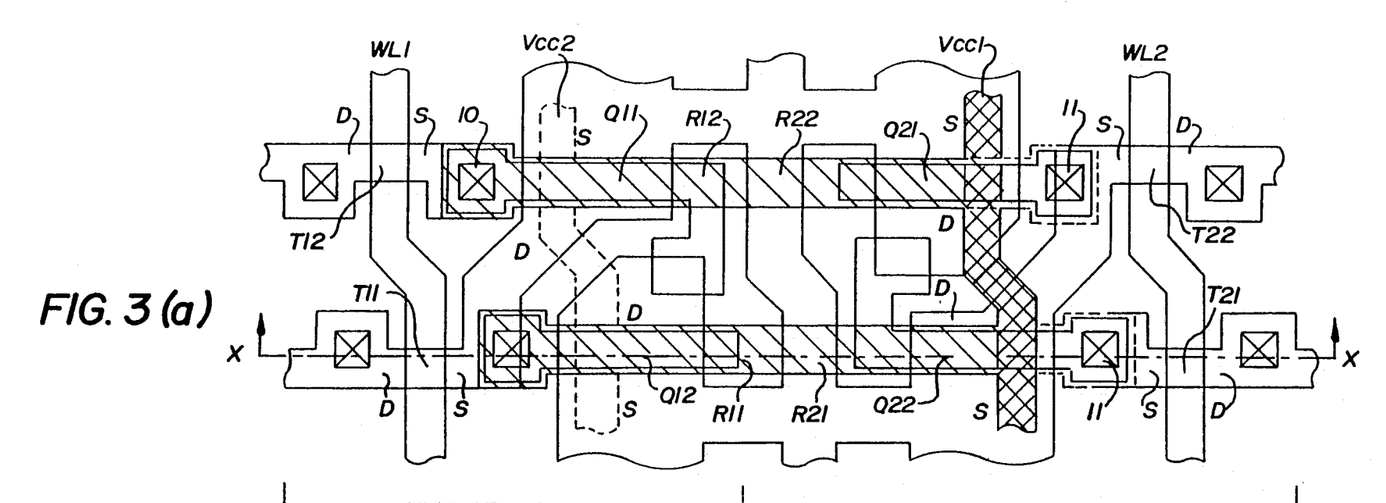
FIG. 3(a) is a schematic plan view illustrating arrangement of electrodes and wirings of a memory cell pair.
Figure 3B:
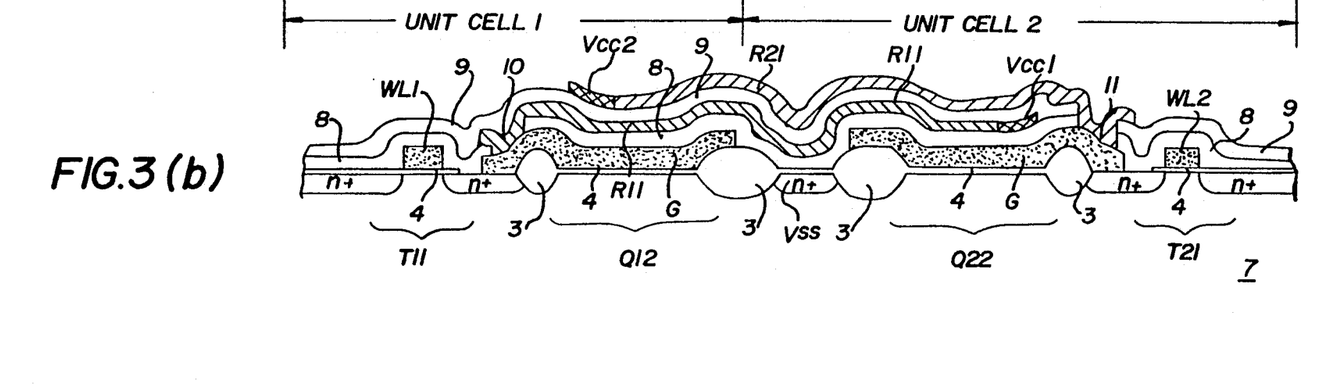
FIG. 3(b) is a schematic cross-sectional view of the device taken in the direction of arrows X—X shown in FIG. (a)

FIG. 3(a) is a schematic plan view illustrating a structural arrangement of elemental devices and wirings for a pair of memory cells for a SRAM which is a first embodiment of the present invention. FIG. 3(b) shows schematically a cross-section of the device of FIG. 3(a) taken in the direction of arrows X—X shown in FIG. 3(a). The left and right halves of the figures show respectively a unit cell 1 and a unit cell 2, which are paired with each other. Compared to the prior art device shown in FIG. 1, the structural arrangement of the load resistors and voltage source line Vcc of the instant invention is different. In the device of FIG. 1, the load resistors and Vcc lines are formed on a single insulation layer 8. On the other hand, in the embodiment of FIGS. 3(a) and (b), the load resistors and the Vcc line for the unit cell 1, and those for the unit cell 2 are formed on different insulation layers, and stacked over each other forming a double layer.

The load resistors R11 and R12 for the inverter transistors Q11 and Q12 of the unit cell 1 are formed on a first insulation layer 8 which covers the entire surface of the device. The voltage source (Vcc1) line for the unit cell 1 is also formed on the first insulation layer 8. The entire surface of these elemental devices, as well as transfer transistors T11-T22 are coated with a second insulation layer 9. The load resistors R21, R22 and a second voltage source line (Vcc2) for the inverter transistors Q21 and Q22 of the unit cell 2 are formed on the second insulation layer 9. The load resistors R11 and R12 are connected respectively to the gate electrodes G of Q11 and Q12 through first contact holes 10. In FIG. 3(a), parts of the load resistors R21, R22 and Vcc2 line which are formed on the second insulation layer 9 are indicated by broken lines in order to distinguish them from those formed on the first insulation layer 8.

Since the load resistors and Vcc lines for the unit cell 1 and unit cell 2 are formed on separate layers, and these layers are stacked on each other, it will be apparent that the pattern of the load resistors can be extended over the entire length of a neighboring unit cell. Accordingly, when compared to the device of FIG. 1, the lengths of the load resistors R11-R22 of the instant invention are elongated twice as long as the lengths of the prior art load resistors. Thus, the resistance value of each load resistor of the instant invention is twice as much while using the same fabrication technology and tolerance. Therefore, if the resistance of the load resistors of the instant invention are used with the device of FIG. 1, the length of the load resistors R11-R22 of FIG. 3 can be cut down to about ½.

Therefore, as long as the progress of photolithography allows the cutting down of the size of other elemental devices, the size of the SRAM device can be cut down. If the size of other elemental devices are decreased to ½ to meet the shortened load resistors, the packing density of the SRAM is increased by four times that of the prior art. In other words, a device having memory capacity which is four times as large can be achieved without increasing the size of the device.

Next, a production process for the first embodiment will be described in order to further clarify the structure of the device by the present invention. The process steps used for the production of this embodiment are all conventional and thus they are described briefly. Of course, various modifications are possible in the process as well as the materials in such a way that the invention is not restricted to the process steps and materials which are disclosed hereinafter.

Figures 4A, 4B:
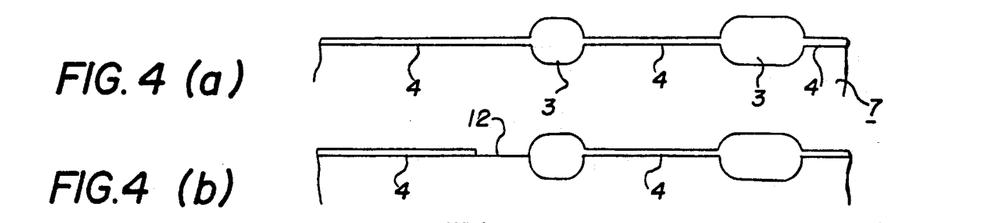
FIG. 4(a) through FIG. 4(h) are cross-sectional diagrams illustrating major steps of a fabrication process for the device shown in FIG. 1.

FIGS. 4(a) through (h) show schematically how a cross-section of the unit cell 1 varies at major steps of the fabrication process. FIGS. 4(a) through (h) show the left half of a cross-section taken in the direction along arrows X—X in FIG. 3(a). First, as shown in FIG. 4(a), a substrate 7 is selectively oxidized while applying photolithography to form field oxide layers 3, and gate oxide layers 4. The former separate the elemental devices to be formed in the substrate 7 from each other, and the latter insulate the gate electrodes from the substrate 7. The gate oxide layer 4 is patterned so as to open a window 12 by photolithography, as shown in FIG. 4(b).

Figure 4C:
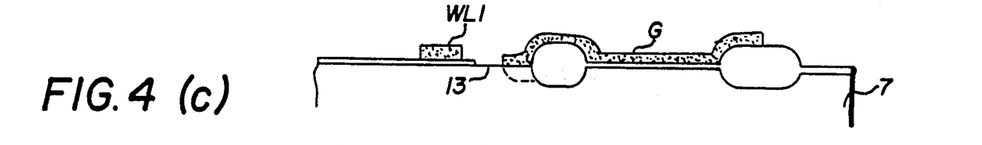
Figure 4D:
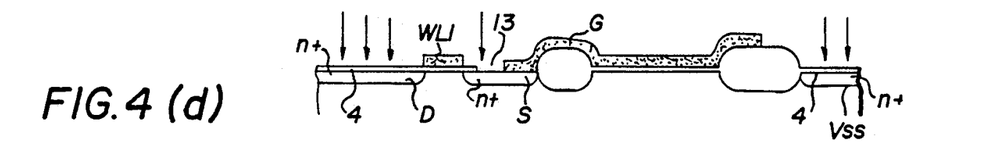

Next, as shown in FIG. 4(c), a first n+ doped polysilicon layer (identified by dots in the figure) of about 400 nm thick is deposited by chemical vapor deposition (CVD) over the entire surface of the substrate, and patterned so as to form a word line WL1, gate electrode G and an opening 13 by photolithography. At this time, a portion of the substrate directly contacting the gate electrode G is doped by an n-type impurity diffused from the first polysilicon layer, as shown by broken lines in FIG. 4(c). Consequently, an n-type impurity is ion-implanted through the gate oxide layer 4 and the opening 13. Through annealing, the drain region D, source region S and the Vss line are formed in the substrate by n+ regions as shown in FIG. 4(d). A portion beneath the word line WL1 becomes a channel region of the transfer transistor T11, and the corresponding portion of the WL1 becomes a gate electrode of T11 (see FIGS. 3(a) and (b)).

Figure 4E:
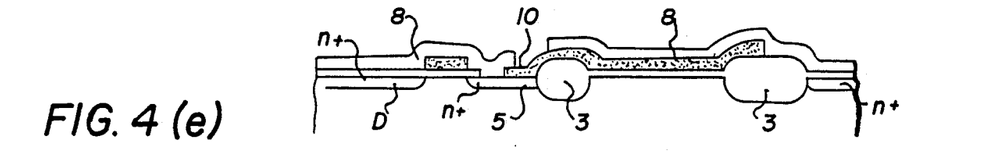

Next, as shown in FIG. 4(e), a silicon dioxide ($SiO_2$) layer 8 of about 100 nm thick is formed over the substrate. In addition first contact holes 10 are opened in the layer 8. The $SiO_2$ layer becomes the first insulation layer 8.

Figure 4F:
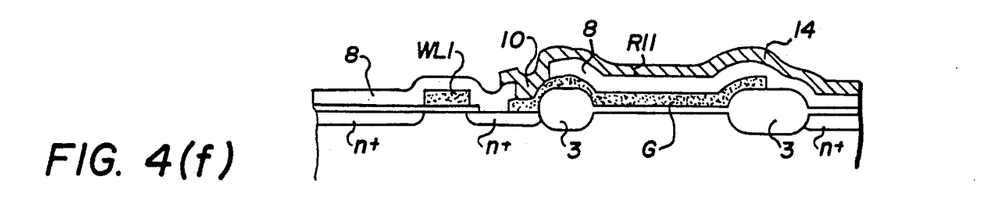

Consequently, as shown in FIG. 4(f), over the first insulation layer 8 is deposited a first non-doped polysilicon layer 14 of 1,000–1,500 Å thick by CVD. At the right hand side edge (not shown) of the first non-doped polysilicon layer 14 is selectively ion-implanted to form the first voltage source line Vcc1 (see, FIG. 3(b)) and the polysilicon layer 14 is patterned to form the load resistors R11 and R12 (not shown). The load resistors R11 and R12 are contacted at each respective end to the gate electrode G through the first contact holes 10. Other ends (not shown) of the load resistors R11 and R12 are connected to the Vcc1 line, as shown in FIG. 3(b).

Figure 4G:
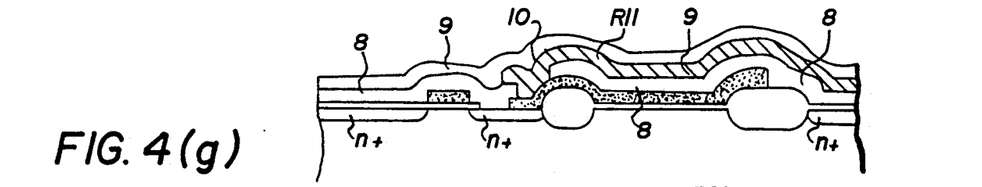

Next, as shown in FIG. 4(g), the entire surface is coated by the second insulation layer 9 which is an $SiO_2$ layer of about 100 nm thick deposited by CVD. In the second insulation layer 9 is formed second contact holes 11 (see, FIGS. 3(a) and (b)). The second contact holes 11 penetrate through the first insulation layer 8, and reach the gate electrodes G of the FETs Q21, Q22 which belong to the unit cell 2, as shown in FIGS. 3(a) and (b).

Figure 4H:
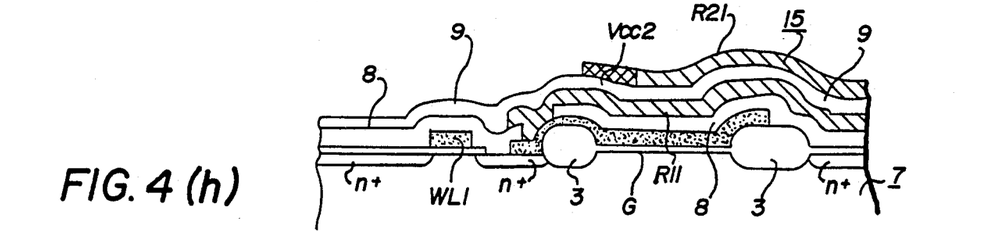

Deposited over the second insulation layer 9 is a second non-doped polysilicon layer 15 1,000–1,500 Å thick by CVD. The left hand side edge portion of the second non-doped polysilicon layer 15 is selectively ion-implanted to form the second Vcc line Vcc2, as shown in FIG. 4(h), and the second polysilicon layer 15 is patterned to form the load resistors R21 and R22 (not shown). The load resistors R21 and R22 are connected at their left ends to the Vcc2 line, but their other ends (not shown) are respectively connected through the second contact holes 11 to the gate electrodes G of the FET Q21 and Q22 which belong to unit cell 2, as shown in FIG. 3(b).

In like manner, a pair of unit cells are fabricated. The following steps are common for finishing the device as a SRAM; namely, the forming of a passivation layer over the device, and the forming of a wiring layer on it. A description for those steps are omitted for the sake of simplicity.

From the above description, it will be apparent that the load resistors and Vcc lines for the unit cell 1 are formed on the first insulation layer 8, and these elements for the unit cell 2 are formed on the second insulation layer 9, and are separated from each other. Moreover, the load resistances for the inverter pair of a flip-flop circuit of the SRAM should be balanced between each other as precisely as possible. The load resistors for the unit cell 1 and unit cell 2 of this embodiment are formed respectively on a same layer (8 or 9) at the same production process; thus, the resistance value of the resistors on the same layer are made so as to be very close to each other. Therefore, the balance between the resistances is very good.

Further, the elongated length of the load resistor provides an additional advantage. As has been described before, the effective length of the load resistor is decreased by diffusion or migration of impurities from the Vcc line which is connected to one end of the load resistors. The shortening effect of the length is the same as with the elongated load resistor. Therefore, if the length is doubled, the effective length of the resistor is more than doubled. For example, if the diffusion length of the impurities is 0.5 $\mu$m, the effective length of a 3 $\mu$m long resistor is reduced to 2.5 $\mu$m. However, the effective length of a 6 $\mu$m long resistor will be 5.5 $\mu$m resulting in 2.2 times longer than the previous length.

Figure 5A:
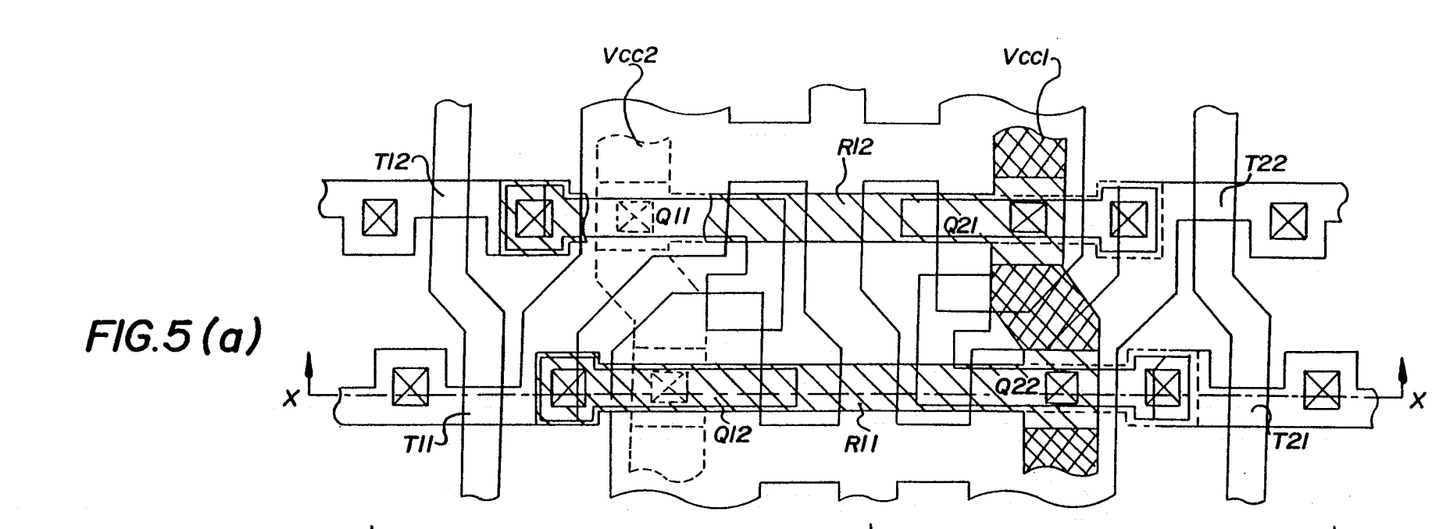
FIG. 5(a) is a schematic plan view illustrating an arrangement of electrodes and wirings of a memory cell pair.
Figure 5B:
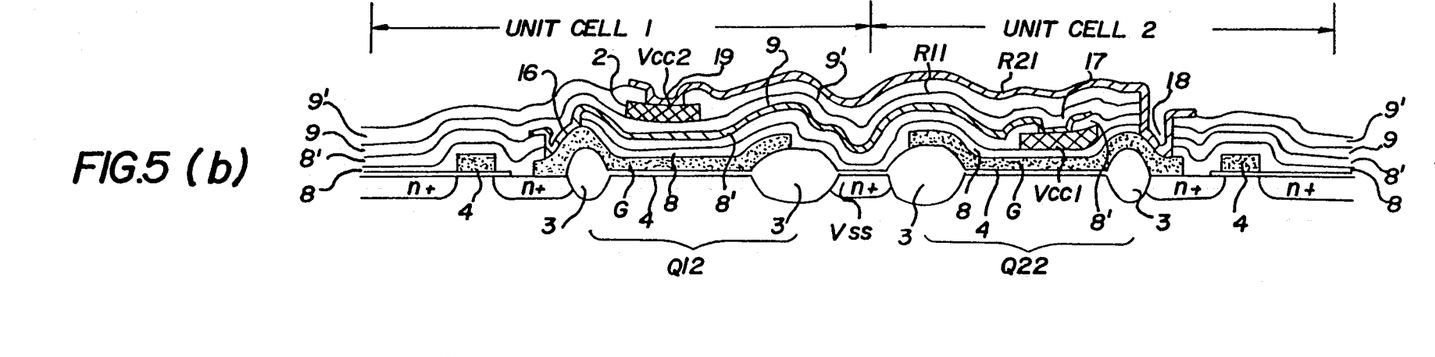
FIG. 5(b) is a schematic cross-sectional view of the device taken in the direction of arrows X—X shown in FIG. 5(a)

FIGS. 5(a) and (b) show a second embodiment of the present invention. A plan view of the device is given in FIG. 5(a) showing an arrangement of elemental devices, and a cross-section is shown in FIG. 5(b). When compared to FIG. 3(a), it will be noticed that the structural arrangement of the elemental devices on the substrate is almost similar to each other, but from a cross-section of the device shown in FIG. 5(b), it will be clear that the voltage source lines Vcc1 and Vcc2 are respectively formed in different layers from those of the load resistors R11, R12 and R21, R22. In FIG. 5(a), parts of the load resistors R21, R22 and the Vcc2 line which belong to the unit cell 2 are indicated by broken lines in order to distinguish them from those counterparts which belong to the unit cell 1.

FIG. 5(b) shows a cross-section taken in the direction of arrows X—X shown in FIG. 5(a). The layers corresponding to the first insulation layer 8 and the second insulation layer 9 of FIG. 3(b) are respectively divided into double layers 8, 8' and 9, 9'. The voltage source line Vcc1 is formed on the first insulation layer 8, and covered with a third insulation layer 8'. The load resistors R11 and R12 for the FETs Q11 and Q12 of the unit cell 1 are formed on the third insulation layer 8', and their left sides are respectively contacted with the gate electrodes G of Q11 and Q12 through the first contact holes 16 formed through the first insulation layer 8 and the third insulation layer 8'. The right side of the load resistors R11 and R12 are respectively contacted with Vcc1 through third contact holes 17 formed on the third insulation layer 8'. The unit cell 1 and the transfer transistors T21, T22 are covered with the second insulation layer 9. Similarly, the voltage source line Vcc2 for the unit cell 2 is formed on the second insulation layer 9, and covered with a fourth insulation layer 9'. The load resistors R21 and R22 for the FETs Q21 and Q22 of the unit cell 2 are formed on the fourth insulation layer 9', and their right sides are respectively contacted with the gate electrodes G of Q21 and Q22 through the second contact holes 18 formed through four insulation layers 8, 8', 9, 9'. The left sides of the load resistors R11 and R12 are respectively contacted with Vcc2 through fourth contact holes 19 formed on the fourth insulation layer 9'.

In the just-described structural arrangement, it becomes possible to design the thickness of the Vcc1 and Vcc2 lines thicker, and the conductivity of polysilicon layer is higher than that of the load resistors R11–R22 because the voltage source lines Vcc1 and Vcc2 are formed in separate layers from the layers forming the load resistors. The width of the Vcc lines can also be increased. Thus, the resistance of the voltage source lines is sufficiently decreased compared to that of the first embodiment; thereby, increasing the operation speed of the device. On the other hand, the layer of the load resistance can be made thinner (e.g., 200°); thus, extending the possibility for further increasing the load resistance, and hence further reducing the unit cell size. Further, the effect of migration of the impurity is eliminated.

The thick layer of polysilicon for the Vcc lines can be utilized for fabricating other parts of the memory device. For example, fuse circuits are inevitable for large scale integrated circuits (LSI) to cut off a failed part of a circuit from the main circuit and switch to a prefabricated redundant circuit. With such a circuit, the yield of the LSI is increased. A surge protection circuit may also be fabricated by using the thick polysilicon layer. However, these circuits are difficult to form in a very thin polysilicon layer; thus, the second embodiment of the instant invention provides the device with the layer for fabricating these circuits which is an additional advantage of the second embodiment of the present invention.

Each of the steps or processes concerning each steps of FIG. 4 will be hereinafter labelled as step (a), (b), or the like, or process (a), (b), or the like. In step (f), the first non-doped polysilicon layer 14 is deposited thicker than that of the first embodiment (e.g., 200 nm thick), and patterned to form the Vcc1 line (see, FIG. 5). The Vcc1 line may be ion-implanted or the polysilicon layer may be doped to have sufficient conductivity. Then, the third insulation layer 8' of SiO$_2$ is deposited by CVD like in the manner of step (f) and again with step (f) to form R11 and R12. Similar processes are repeated for the unit cell 2 at step (h).

By separating the layer of load resistors from other parts of the device in like manner as in the second embodiment, the material of the load resistors can be changed from polysilicon to other materials; such as, silicon carbide (SiC), amorphous silicon, molybdenum alloy, or the like which permits the use of alternative materials.

It will be understood that such a structure of separated layer for the load resistance or separated Vcc line may be applied directly to the prior art structure of FIG. 1. For example, the load resistors R11–R22 may be formed on other layers. However, the effect of the separated layer appears more apparent when applied to separate R11, R12 from R21, R22 as in the second embodiment.

Figure 6:
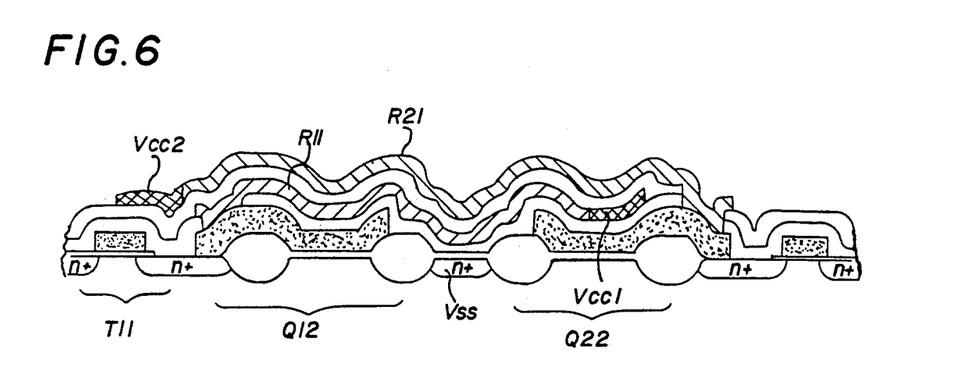
FIG. 6 shows a cross-sectional view of a third embodiment of the present invention, which modifies the first embodiment of FIG. 3 to further elongate the length of the resistor.

FIG. 6 shows a cross-section of a third embodiment of the present invention. The figure shows a corresponding part of FIG. 3(b). In comparing FIG. 6 with FIG. 3(b), the load resistors R21 and R22 are formed over the inverter FETs Q12 and Q22 and Q11 and Q21 respectively in both embodiments, while in the third embodiment in FIG. 6, the load resistors R21 and R22 also extend over the transfer transistors T11 and T12 respectively allowing for more elongation of the load resistors R21 and R22 than those of the first embodiment.

The third embodiment may be considered as a modification of the first embodiment. However, the elongated R21 and R22 mean higher resistances. Thus, the thickness of the second non-doped polysilicon layer 15 (FIG. 4(h)) may be increased to compensate the increase of the resistance; thus, making it easier to decrease the resistivity of the polysilicon layer used for fuse or protection circuits. The balance of the load resistors for each inverter pair of flip-flop circuits is maintained because the load resistors for the pair of FETs are fabricated on the same layer with the same process step.

As has been described above, the present invention enables the increase of the resistance of load resistors for the flip-flop circuit in SRAM devices. Thus, the size of a unit cell can be reduced, and the packing density of the device is increased.

While the invention has been particularly shown and described in reference to preferred embodiments thereof, it will be understood by those skilled in the art that changes in form and details may be made therein without departing from the spirit and scope of the invention.

I claim:

1. A semiconductor static random access memory device formed on a semiconductor substrate and a plurality of insulation layers formed over said semiconductor substrate, said semiconductor static random access memory device, comprising:

a plurality of unit cell pairs, wherein each of said unit cell pairs includes a first unit cell and a second unit cell which are arranged adjacent in a data-line direction, each first unit cell and each second unit cell comprises a flip-flop which is formed by a pair of inverter circuits, each inverter circuit includes a field effect transistor formed on said substrate and a load resistor, and load resistors of each first unit cell and load resistors of each second unit cell are formed on different insulation layers and have respectively a layer pattern extending over a substrate surface of an adjacent unit cell within each of said unit cell pairs.

2. The semiconductor static random access memory device as set forth in claim 1, wherein said load resistors are made from a material selected from a group consisting of silicon carbide and amorphous silicon.

3. The semiconductor static random access memory device as set forth in claim 1, wherein said load resistors are made of molybdenum alloy.

4. The semiconductor static random access memory device as set forth in claim 1, wherein each of said first unit cells further comprises a first voltage source line for supplying a source voltage to that first unit cell, wherein each of said second unit cells further comprises a second voltage source line for supplying the source voltage to that second unit cell, wherein each first voltage source line is formed on a first insulation layer which is formed over said substrate, wherein load resistors of each first unit cell are formed on a third insulation layer which is formed over said first insulation layer, wherein each second voltage source line is formed on a second insulation layer which is formed over said third insulation layer, and wherein load resistors of each second unit cell are formed on a fourth insulation layer which is formed over said second insulation layer.

5. The semiconductor static random access memory device as set forth in claim 1, wherein each of said first unit cells further comprises a first voltage source line for supplying a source voltage to that first unit cell, wherein each of said second unit cells further comprises a second voltage source line for supplying a source voltage to that second unit cell, wherein load resistors of each first unit cell and each first voltage source line are formed on a first insulation layer formed over said substrate, and wherein load resistors of each second unit cell and each second voltage source line are formed on a second insulation layer which is formed over said first insulation layer.

6. The semiconductor static random access memory device as set forth in claim 5, wherein each of said unit cells further comprises a transfer transistor having an FET formed on said substrate and said transfer transistor is positioned at outside regions of each of said unit cell pairs in the data-line direction, said transfer transistor sending out information on whether an associated inverter is in a high state or a low state to an outer circuit, and wherein load resistors formed on said second insulation layer are longer than load resistors formed on said first insulation layer.

7. The semiconductor static random access memory device as set forth in claim 4 or 6, wherein the thickness of each of said load resistors is thinner than the thickness of either of said first and second voltage source lines.

8. The semiconductor static random access memory device as set forth in claim 1, 4, 5 or 6, wherein said substrate is a silicon substrate, and wherein each insulation layer is a silicon dioxide layer.

9. The semiconductor static random access memory device as set forth in claim 4, 5 or 6, wherein said load resistors and said first and second voltage source lines are made from polysilicon.

10. The semiconductor static random access memory device as set forth in claim 9, wherein said load resistors and said first and second voltage source lines are ionimplanted to increase conductivity.

11. The semiconductor static random access memory device as set forth in claim 9, wherein said load resistors and said first and second voltage source lines are doped to increase conductivity.

* * * * *